(12) United States Patent
Vermeulen

(10) Patent No.: US 9,041,913 B2
(45) Date of Patent: May 26, 2015

(54) LITHOGRAPHIC APPARATUS AND DEVICE MANUFACTURING METHOD WITH BEARING TO ALLOW SUBSTRATE HOLDER TO FLOAT WITH RESPECT TO SUBSTRATE TABLE

(75) Inventor: Johannes Petrus Martinus Bernardus Vermeulen, Helmond (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1011 days.

(21) Appl. No.: 12/627,108

(22) Filed: Nov. 30, 2009

(65) Prior Publication Data
US 2010/0157273 A1 Jun. 24, 2010

Related U.S. Application Data

(60) Provisional application No. 61/139,956, filed on Dec. 22, 2008.

(51) Int. Cl.
*G03B 27/58* (2006.01)
*G03F 7/20* (2006.01)

(52) U.S. Cl.
CPC ............... *G03B 27/58* (2013.01); *G03F 7/707* (2013.01)

(58) Field of Classification Search
CPC ..................................................... G03F 7/707
USPC ............................... 355/72, 73–76, 53
See application file for complete search history.

(56) References Cited

U.S. PATENT DOCUMENTS

| | | | | |
|---|---|---|---|---|
| 4,651,009 A | * | 3/1987 | Totsuka | 250/442.11 |
| 6,283,041 B1 | * | 9/2001 | Ono | 108/20 |
| 2006/0132737 A1 | * | 6/2006 | Magome et al. | 355/53 |
| 2007/0013893 A1 | * | 1/2007 | Loopstra | 355/72 |

FOREIGN PATENT DOCUMENTS

| | | |
|---|---|---|
| JP | 63-296235 | 12/1988 |
| JP | 05-259024 | 10/1993 |
| JP | 07-130639 | 5/1995 |
| JP | 07-288276 | 10/1995 |
| JP | 2006-222345 | 8/2006 |
| JP | 2008-250072 | 10/2008 |

OTHER PUBLICATIONS

Japanese Office Action mailed May 1, 2012 in corresponding Japanese Patent Application No. 2009-280052.

* cited by examiner

*Primary Examiner* — Chi-How Michael Liu
(74) *Attorney, Agent, or Firm* — Pillsbury Winthrop Shaw Pittman, LLP

(57) ABSTRACT

A lithographic apparatus includes an illumination system configured to condition a radiation beam; a support constructed to support a patterning device, the patterning device being capable of imparting the radiation beam with a pattern in its cross-section to form a patterned radiation beam; a substrate table including a substrate holder constructed to hold a substrate; and a projection system configured to project the patterned radiation beam onto a target portion of the substrate, wherein the substrate table is constructed and arranged to reduce or eliminate slip and hysteresis in position and orientation between the substrate table and the substrate holder.

21 Claims, 2 Drawing Sheets

LITHOGRAPHIC APPARATUS AND DEVICE MANUFACTURING METHOD WITH BEARING TO ALLOW SUBSTRATE HOLDER TO FLOAT WITH RESPECT TO SUBSTRATE TABLE

CROSS REFERENCE TO RELATED APPLICATIONS

This application claims priority and benefit under 35 U.S.C. §119(e) to U.S. Provisional Patent Application No. 61/139,956, entitled "Lithographic Apparatus and Device Manufacturing Method", filed on Dec. 22, 2008. The content of that application is incorporated herein in its entirety by reference.

FIELD

The present invention relates to a lithographic apparatus and a method for manufacturing a device.

BACKGROUND

A lithographic apparatus is a machine that applies a desired pattern onto on an object such as a substrate. A lithographic apparatus can be used, for example, in the manufacture of integrated circuits (ICs). In such a case, a patterning device, which may be an object such as an mask or a reticle, may be used to generate a circuit pattern to be formed on an individual layer of the IC. This pattern can be transferred onto a target portion (e.g. including part of, one, or several dies) on an object such as a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus the substrate may be positioned underneath the projection system for projection of the image of the patterning device on target portions of the substrate. To project the image of the patterning device on different target portions of the substrate and to scan the substrate underneath the projection system the substrate needs to be moved. A substrate table is therefore provided with a substrate holder which is moveable by a substrate table. The substrate table is transferring its movements via the substrate holder to the substrate. The substrate holder may be clamped to the substrate chuck via a friction based interface preloaded e.g. by vacuum pressure or electrostatic pressure. A higher throughput of the lithographic projection apparatus can be achieved by faster movements of the substrate underneath the projection system. The faster movements will be achieved by higher accelerations which may cause (local) slip and hysteresis in position of the substrate holder relative to the substrate table. If a (local) slip and hysteresis occurs between the substrate table and the substrate holder, the substrate may be at another position than previously determined and be potentially distorted. This may lead to wrongly exposed substrates after the acceleration has ended with negative effect on overlay.

SUMMARY

It is desirable to provide a lithographic apparatus in which local slip and hysteresis are substantially reduced.

According to an embodiment of the invention, there is provided a lithographic apparatus including: an illumination system configured to condition a radiation beam; a support constructed to support a patterning device, the patterning device being capable of imparting the radiation beam with a pattern in its cross-section to form a patterned radiation beam; a substrate table being constructed and arranged to be moveable in the apparatus and provided with a substrate holder constructed to hold a substrate; a substrate table drive including a long stroke module configured to exert a force on a long stroke mover and a short stroke module configured to exert a force between the long stroke mover and the substrate table; and, a projection system configured to project the patterned radiation beam onto a target portion of the substrate, wherein the substrate table includes a bearing configured to support the substrate holder, the bearing allowing the substrate holder to float with respect to the substrate table.

According to a further embodiment of the invention there is provided an apparatus including: an object table constructed and arranged to be moveable in the apparatus; an object holder provided to the object table constructed to hold an object; and an object holder positioning system including a table drive including a long-stroke module configured to exert a force on a long stroke mover and a short-stroke module configured to exert a force between the long stroke mover and the object table, wherein the object table includes a bearing configured to support the object holder, the bearing allowing the object holder to float in a frictionless manner with respect to the object table.

According to a further embodiment of the invention there is provided a device manufacturing method including: holding an object with an object holder provided to an object table; exerting a force between a long stroke mover and the object table with a short-stroke module provided to an object table drive; exerting a force between the long stroke mover and the machine base frame or balance mass with a long-stroke module provided to the object table drive; and keeping the object holder floating with respect to the object with a bearing.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
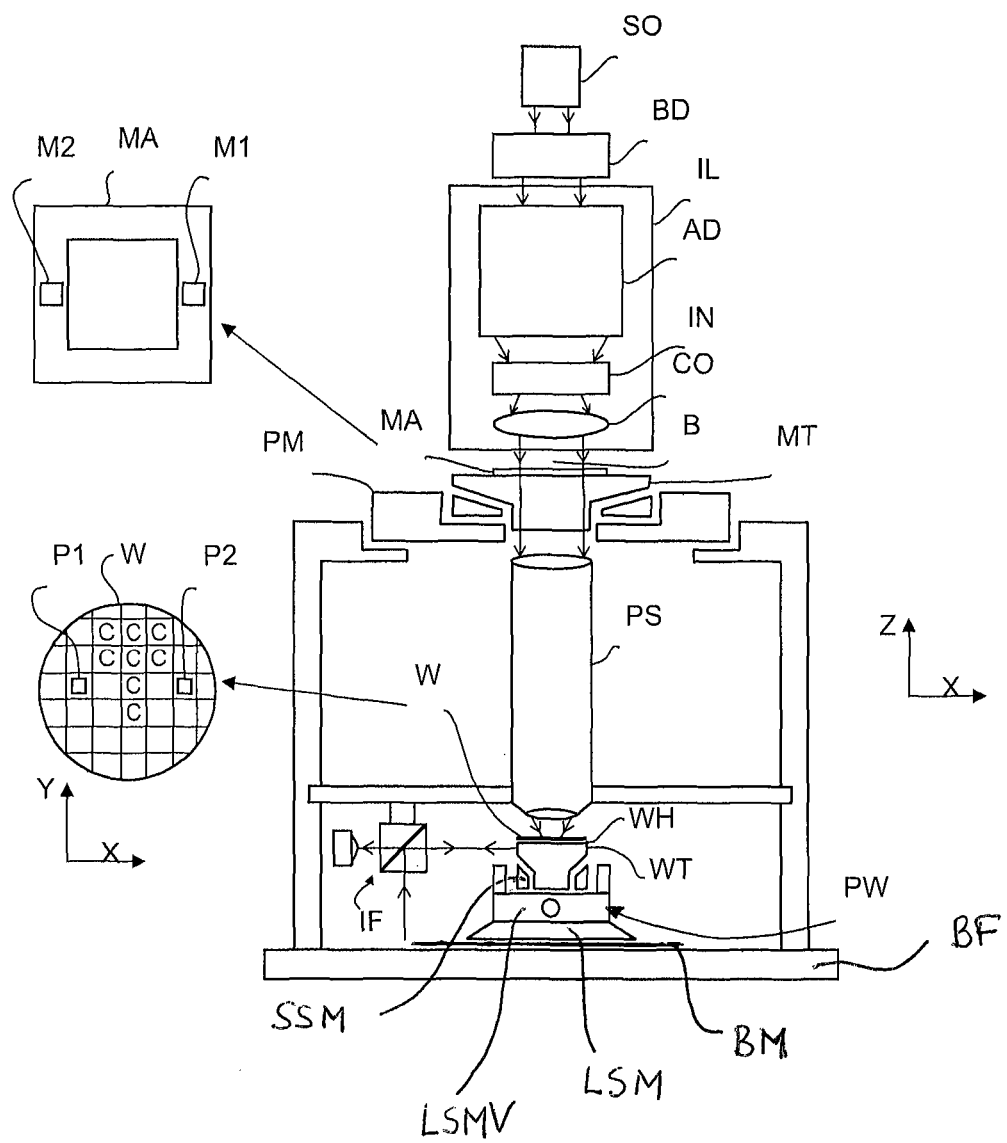
FIG. 1 depicts a lithographic apparatus according to an embodiment of the invention.

FIG. 1 schematically depicts a lithographic apparatus according to an embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. an object, a mask) MA and connected to a positioning device or patterning device drive (e.g. mask table drive) PM configured to accurately position the patterning device in accordance with certain parameters. The apparatus also includes a substrate table (e.g. an object or a wafer table) WT provided with a substrate holder WH (e.g. object holder) constructed to hold a substrate (e.g. an object, a resist coated wafer) W. The substrate holder WH being clamped on the substrate table WT with a vacuum pressure. Burls are provided in between the substrate table WT to interface with the substrate holder WH. The substrate table WT being connected to a substrate table positioning device or substrate table drive (e.g. object drive) PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or an object table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the substrate table drive PW and position sensor IF (e.g. an interferometric device, optical encoder or capacitive sensor), the substrate WT can be moved accurately, e.g. so as to position different target portions C in the path of the radiation beam B. Similarly, the patterning device drive (e.g. mask table drive) PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long stroke module (coarse positioning) and a short stroke module (fine positioning), which form part of the patterning device drive (e.g. mask table drive) PM. Similarly, movement of the substrate table WT may be realized using a long stroke module LSM configured to exert a force on a long stroke mover LSMV and a short stroke module SSM configured to exert a force between the long stroke mover LSMV and the substrate table. Both the short stroke and long stroke modules forming part of the substrate table drive PW. The long stroke module LSM may exert a force to a balance mass BM constructed and arranged to absorb a reaction force by moving almost freely within the lithographic apparatus. The long stroke module LSM may also exert a force on the rest of the lithographic apparatus. FIG. 1 also shows a base frame BF. In the case of a stepper (as opposed to a scanner) the patterning device support (e.g. mask table) MT may be connected to a short stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate WT or "substrate support" are kept essentially stationary, while an entire pattern imparted to the radiation beam is projected onto a target portion C at one time (i.e. a single static exposure). The substrate W or "substrate support" is then shifted in the X and/or Y direction so that a different target portion C can be exposed. In step mode, the maximum size of the exposure field limits the size of the target portion C imaged in a single static exposure.

2. In scan mode, the patterning device (e.g. mask) MT or "mask support" and the substrate table WT or "substrate support" are scanned synchronously while a pattern imparted to the radiation beam is projected onto a target portion C (i.e. a single dynamic exposure). The nominal velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the length (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Slip between the substrate table WT and the substrate holder WH may be caused by local deformation of the substrate table WT with respect to the substrate holder WH due to forces exerted by the substrate table drive PW on the substrate table WT. The areas of the substrate table WT where the substrate table drive PW is connected to the substrate holder WH may suffer from the largest deformations caused by the substrate table drive PW and may therefore suffer the most from slip and hysteresis in position between the substrate table and the substrate holder.

Figure 2:
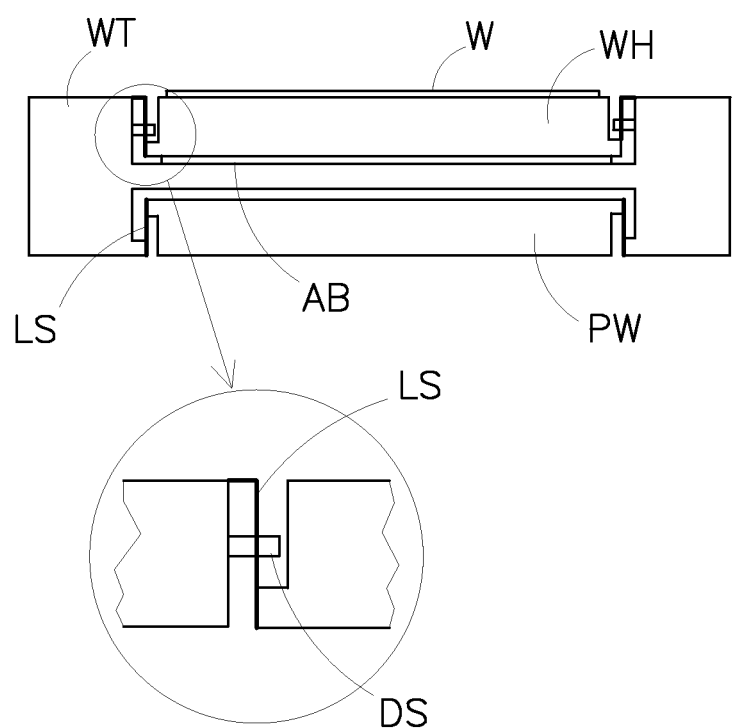
FIG. 2 depicts a substrate holder and a part of a substrate table according to an embodiment of the invention.

A bearing AB (see FIG. 2) may be provided between the substrate holder WH and the substrate table WT. The bearing AB is constructed and arranged to allow the substrate holder WH to float with respect to the substrate table WT. Forces exerted on the WT by the substrate table drive PW may be transferred to the substrate holder WH via the sides of the substrate table WT. Any in-plane deformation of the substrate table WT will no longer lead to slip and hysteresis at the interface between substrate table WT and the substrate holder WH because the bearing will provide a friction-free interface. The bearing AB that provides the floating relationship between the substrate table and substrate holder as disclosed herein may, in some embodiment, be an air bearing, a flexure bearing, a magnetic bearing, or a visco-elastic bearing.

The bearing can be a contact free bearing configured to support the substrate holder, the contact free bearing permitting relative movement of the substrate holder relative to the substrate table. The contact free bearing may be configured to permit relative movement of the substrate holder relative to the substrate table along a direction substantially perpendicular to a plane defined by the lower surface of the substrate holder.

The sides of the substrate holder WH and the substrate table WT may be connected with flexures such as a series of so-called folded leaf spring LS. The flexures may allow the substrate holder WH to move a little with respect to the substrate table WT, especially in radial direction due to differences in thermal expansion between the substrate holder and the substrate chuck. Because it is desirable to position the substrate holder WH with very high precision it may be desirable to provide differential sensors DS between the substrate table WT and the substrate holder WH. The differential sensors DS may measure the relative movement between the substrate holder WH and the substrate table WT which may be used to correct the in-plane position and orientation of the substrate table WT if required with the substrate table drive PW. In an embodiment, the sensor is configured to measure a position and orientation of the substrate holder with respect to the substrate table. The sensor may be a capacitive sensor or an optical encoder.

In an alternative embodiment according to the invention, an active bearing system may be used for the bearing AB. For example, a variable reluctance or Lorenz actuator may be used as an active bearing to float the substrate holder WH with respect to the substrate table WT. Additional differential sensors DS may be used to provide a control signal to the active bearing system to position the substrate holder WH in out-of-plane degrees of freedom.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components. Any use of the terms substrate, wafer, mask or reticle may be considered synonymous with the more general term object.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
a support constructed to support a patterning device, the patterning device being capable of imparting a radiation beam with a pattern in its cross-section to form a patterned radiation beam;
a substrate table comprising a substrate holder constructed and arranged to hold a substrate, the substrate table, in use, being movable in a plane substantially parallel with a top surface of the substrate; and
a projection system configured to project the patterned radiation beam onto a target portion of the substrate,
wherein the substrate table comprises a bearing configured to support the substrate holder, the bearing allowing the substrate holder to float with respect to the substrate table,
wherein the substrate holder is connected to the substrate table with at least one physical connection, and
wherein the at least one physical connection comprises a flexure that holds the substrate holder movably in a radial direction of the substrate with respect to the substrate table.

2. The apparatus according to claim 1, wherein the substrate holder is connected to the substrate table at a plurality of locations.

3. The apparatus according to claim 2, wherein the substrate holder is connected, at a side thereof, via the at least one physical connection to a side wall of a recess in the substrate table, said recess accommodating the substrate holder.

4. The apparatus according to claim 1, wherein the flexure is a leaf spring.

5. The apparatus according to claim 1, wherein the at least one physical connection is a series of folded leaf springs.

6. The apparatus according to claim 1, wherein the bearing comprises a gas bearing.

7. The apparatus according to claim 1, wherein the bearing comprises flexure bearings.

8. The apparatus according to claim 1, wherein the bearing comprises an active bearing.

9. The apparatus according to claim 8, wherein the active bearing comprises one or more variable reluctance actuators.

10. The apparatus according to claim 8, wherein the active bearing comprises one or more Lorenz actuators.

11. The apparatus according to claim 1, further comprising a substrate table drive comprising a long stroke module configured to exert a force on a long stroke mover and a short stroke module configured to exert a force between the long stroke mover and the substrate table.

12. The apparatus according to claim 11, wherein the long stroke module is configured to exert a force between the long stroke mover and the rest of the lithographic apparatus.

13. The apparatus according to claim 11, wherein the long stroke module is configured to exert a force between the long stroke mover and a balance mass moveable within the lithographic apparatus.

14. The apparatus according to claim 1, wherein, in use, the substrate table is subjected to accelerations and deceleration forces in a plane substantially perpendicular to a path of the patterned radiation beam.

15. The apparatus according to claim 1, wherein the bearing is configured to support the substrate holder in a manner such that an entire lower surface of the substrate holder is uncoupled to the substrate table.

16. The apparatus according to claim 1, wherein the substrate holder includes one or more sensors configured to measure a position and orientation of the substrate holder with respect to the substrate table.

17. The apparatus according to claim 16, wherein the one or more sensors are capacitive sensors or optical encoders.

18. An apparatus comprising:
an object table constructed and arranged to be moveable in the apparatus;
an object holder provided on the object table, the object holder constructed to hold an object, the object table, in use, being movable in a plane substantially parallel with a top surface of the object; and
an object holder positioning system comprising a table drive comprising a long-stroke module configured to exert a force on a long stroke mover and a short-stroke module configured to exert a force between the long stroke mover and the object table,
wherein the object table comprises a bearing configured to support the object holder, the bearing allowing the object holder to float in a frictionless manner with respect to the object table, and wherein the object holder is connected to the object table with at least one physical connection, and wherein the at least one physical connection comprises a flexure that holds the substrate holder movably in a radial direction of the substrate with respect to the substrate table.

19. A device manufacturing method comprising:

holding an object with an object holder provided on an object table, the object table, in use, being movable in a plane substantially parallel with a top surface of the object;

exerting a force between a long stroke mover and the object table with a short-stroke module provided on an object table drive;

exerting a force between the long stroke mover and a machine base frame or balance mass with a long-stroke module provided on the object table drive; and, keeping the object holder floating with respect to the object table with a bearing, wherein the object holder is connected to the object table with at least one physical connection, and wherein the at least one physical connection comprises a flexure that holds the substrate holder movably in a radial direction of the substrate with respect to the substrate table.

20. A lithographic apparatus comprising:

a support constructed to support a patterning device, the patterning device being capable of imparting a radiation beam with a pattern in its cross-section to form a patterned radiation beam;

a substrate table comprising a substrate holder constructed and arranged to hold a substrate, the substrate table, in use, being movable in a plane substantially parallel with a top surface of the substrate; and a projection system configured to project the patterned radiation beam onto a target portion of the substrate, wherein the substrate table comprises a contact free bearing configured to support the substrate holder, the contact free bearing permitting relative movement of the substrate holder relative to the substrate table, wherein the substrate holder is connected to the substrate table with at least one physical connection, and wherein the at least one physical connection comprises a flexure that holds the substrate holder movably in a radial direction of the substrate with respect to the substrate table.

21. The apparatus according to claim 20, wherein the contact free bearing is configured to permit relative movement of the substrate holder relative to the substrate table along a direction substantially perpendicular to a plane defined by a lower surface of the substrate holder.

* * * * *